US005688719A

United States Patent [19]
Tsai et al.

[11] Patent Number: 5,688,719
[45] Date of Patent: Nov. 18, 1997

[54] METHOD FOR PLASMA HARDENING OF PATTERNED PHOTORESIST LAYERS

[75] Inventors: Chia-Shiung Tsai, Shuang-Hsi; Sung-Mu Hsu, I-Lan, both of Taiwan

[73] Assignee: Taiwan Semiconductor Manufacturing Company Ltd., Hsin-Chu, Taiwan

[21] Appl. No.: 660,303

[22] Filed: Jun. 7, 1996

[51] Int. Cl.$^6$ .................................................. H01L 21/44
[52] U.S. Cl. ................... 437/194; 437/229; 156/659.11; 156/634.11
[58] Field of Search ............................ 437/194, 229, 437/937; 156/659.11, 634.1

[56] References Cited

U.S. PATENT DOCUMENTS

| 4,022,927 | 5/1977 | Pfeiffer et al. . | |
|---|---|---|---|
| 4,080,267 | 3/1978 | Castellani et al. . | |
| 4,253,888 | 3/1981 | Kikuchi . | |
| 4,444,618 | 4/1984 | Saia et al. | 156/643.1 |
| 5,470,693 | 11/1995 | Sachdeu et al. | 430/315 |

FOREIGN PATENT DOCUMENTS

| 57-181378 | 5/1982 | Japan . |
|---|---|---|
| 280005 | 4/1996 | Taiwan . |

OTHER PUBLICATIONS

S. Hattori et al. "Vacuuam lithography using plasma polymerization and plasma development" Thin Solid Films (11 Sep. 1981) vol. 83, No. 2 pp. 189–196. (Abstract only).
S.K. Ghandhi "VLSI Fabrication Principles" (1983) John Wiley and Sons, pp. 446–447.
S. Wolf et al "Silicon Processing for the VLSI Era vol. I" (1986) Lattice Press. Calif. p. 546.
S.Wolf, "Silicon Processing For The VLSI Era–vol 1"–Lattice Press, Sunset Beach, CA, p. 452–453.

*Primary Examiner*—John Niebling
*Assistant Examiner*—C. Everhart
*Attorney, Agent, or Firm*—George O. Saile; Stephen B. Ackerman; Alek P. Szecsy

[57] ABSTRACT

A method for plasma hardening a patterned photoresist layer. There is first provided a semiconductor substrate which has formed upon its surface a patterned photoresist layer. The patterned photoresist layer is then exposed to a hydrogen containing plasma for a time sufficient to harden the patterned photoresist layer against a Reactive Ion Etch (RIE) etch plasma to which the patterned photoresist layer is later exposed. A blanket layer residing beneath the plasma hardened photoresist layer may then be patterned through the Reactive Ion Etch (RIE) etch plasma without softening, erosion and/or consumption of the plasma hardened patterned photoresist layer.

19 Claims, 2 Drawing Sheets

METHOD FOR PLASMA HARDENING OF PATTERNED PHOTORESIST LAYERS

BACKGROUND OF THE INVENTION

1. Field of the Invention

The present invention relates generally to patterned photoresist layers within integrated circuits. More particularly, the present invention relates to methods for plasma hardening of patterned photoresist layers within integrated circuits.

2. Description of the Related Art

Integrated circuits are formed upon semiconductor substrates within and upon whose surfaces are formed transistors, resistors, capacitors and other electrical circuit elements. The electrical circuit elements are connected internally and externally to the semiconductor substrate upon which they are formed through patterned conductor layers which are separated by insulator layers.

The traditional method for forming patterned layers, including patterned conductor layers, within integrated circuits has involved forming a patterned photoresist layer upon a blanket layer, which blanket layer in turn resides upon a semiconductor substrate. The blanket layer is then etched employing the patterned photoresist layer as an etch mask to form a patterned layer from which may be formed desired electrical circuit elements within the integrated circuit. The patterning is typically, although not exclusively, undertaken through a Reactive Ion Etch (RIE) plasma etch method employing an etchant composition appropriate to the blanket layer which is desired to be patterned.

Although the use of the Reactive Ion Etch (RIE) plasma etch method for patterning blanket layers which reside beneath patterned photoresist layers has proven to be a valuable method for patterning those blanket layers, the Reactive Ion Etch (RIE) plasma etch method for patterning blanket layers is not without problems. In particular, patterned photoresist layers which are exposed to Reactive Ion Etch (RIE) plasma etchants which are employed in patterning blanket layers are often softened, eroded and/or consumed in Reactive Ion Etch (RIE) etch plasmas which are particularly corrosive. Particularly corrosive Reactive Ion Etch (RIE) etch plasmas are typically, although not exclusively, employed when patterning blanket conductor layers to form patterned conductor layers.

Of the methods for alleviating patterned photoresist layer softening, erosion and/or consumption when a patterned photoresist layer is expected to be exposed to a particularly corrosive Reactive Ion Etch (RIE) etch plasma, a common method is to hard-bake the patterned photoresist layer at an elevated temperature for several minutes. Typically, the patterned photoresist layer will be hard-baked immediately subsequent to patterning of the blanket photoresist layer from which is formed the patterned photoresist layer. The value of post-baking patterned photoresist layers to provide patterned photoresist layers exhibiting reduced susceptibility to softening, erosion and/or consumption in corrosive Reactive Ion Etch (RIE) etch plasmas is, in general, disclosed in the art. See, for example, S. Wolf, Silicon Processing for the VLSI Era, (Lattice Press: Sunset Beach, Calif. (1986)) pp. 452–53.

Also disclosed by Wolf is the possibility of achieving equivalent Reactive Ion Etch (RIE) plasma etch resistance of patterned photoresist layers through the method of plasma hardening of those patterned photoresist layers. While the possibility of achieving Reactive Ion Etch (RIE) plasma etch resistance of patterned photoresist layers through the method of plasma hardening of those photoresist layers has been generally disclosed, little else is disclosed pertaining to specific enabling methods and materials through which patterned photoresist layers may be plasma hardened.

Thus, it is desirable in the art to provide specific enabling methods and materials through which patterned photoresist layers may be plasma hardened to provide Reactive Ion Etch (RIE) plasma etch resistance of those patterned photoresist layers. It is towards that goal that the present invention is directed.

SUMMARY OF THE INVENTION

A first object of the present invention is to provide enabling methods and materials through which patterned photoresist layers within integrated circuits may be plasma hardened against softening, erosion and/or consumption when those patterned photoresist layers are employed in patterning through a Reactive Ion Etch (RIE) plasma etch method blanket layers which reside beneath those plasma hardened patterned photoresist layers.

A second object of the present invention is to provide enabling methods and materials in accord with the first object of the present invention, which enabling methods and materials provide readily manufacturable processes.

In accord with the objects of the present invention there is provided a method for plasma hardening a patterned photoresist layer. To practice the method of the present invention, there is first provided a semiconductor substrate which has formed upon its surface a patterned photoresist layer. The patterned photoresist layer is then exposed to a hydrogen containing plasma for a time sufficient to harden the patterned photoresist layer against a Reactive Ion Etch (RIE) etch plasma to which the patterned photoresist layer is later exposed. Optionally, a blanket layer is formed upon the semiconductor substrate beneath the patterned photoresist layer and the blanket layer is patterned to form a patterned layer through use of the Reactive Ion Etch (RIE) etch plasma against which the patterned photoresist layer has been hardened.

The method of the present invention provides a patterned photoresist layer within an integrated circuit, which patterned photoresist layer is plasma hardened against softening, erosion and/or consumption when exposed to Reactive Ion Etch (RIE) etchants which are employed in patterning blanket layers which reside beneath the plasma hardened patterned photoresist layer. The method of the present invention provides that a patterned photoresist layer may be hardened through exposure to a hydrogen containing plasma. Although the mechanism by which the hydrogen containing plasma hardens the patterned photoresist layer is not entirely well understood, it is nonetheless clear that plasma hardening the patterned photoresist layer with a hydrogen containing plasma provides a plasma hardened patterned photoresist layer which is hardened against Reactive Ion Etch (RIE) etch plasmas to which the plasma hardened patterned photoresist layer may later be exposed.

The methods and materials of the present invention provide a readily manufacturable process. Methods by which plasmas may in general be formed for the purpose of modifying layers within integrated circuits are known in the art. The method of the present invention provides specific plasma compositions and conditions not previously disclosed under which patterned photoresist layers within integrated circuits may be plasma hardened. Thus, the method of the present invention is readily manufacturable.

BRIEF DESCRIPTION OF THE DRAWINGS

The accompanying drawings, which form a material part of this disclosure, show the following:

3

Figure 1:
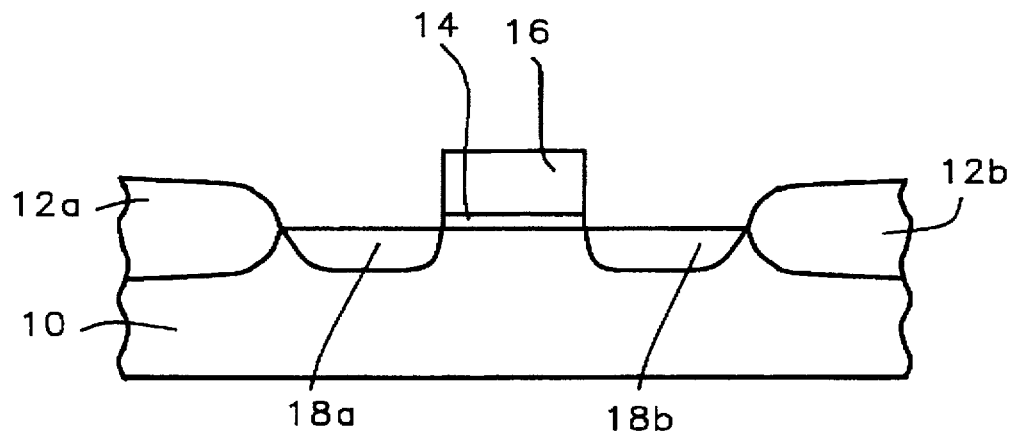
Figure 2:
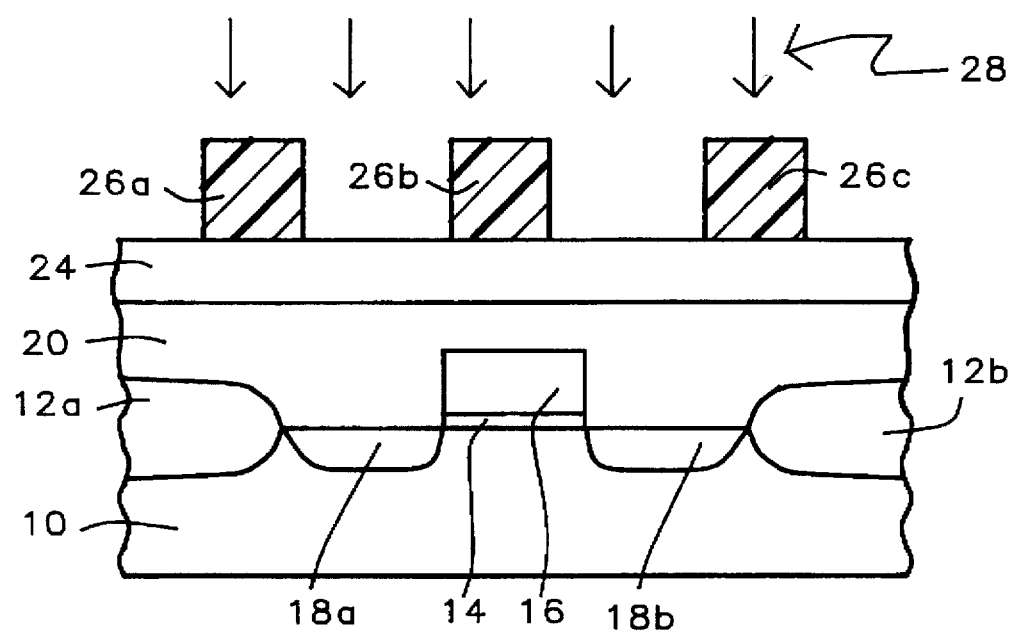
Figure 3:
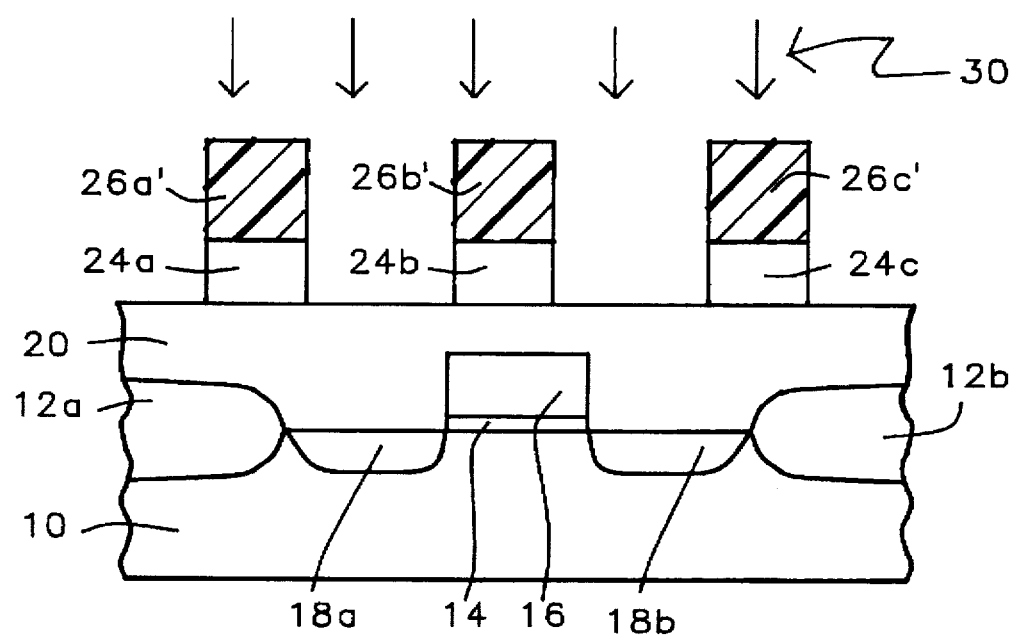

FIG. 1 to FIG. 3 show a series of schematic cross-sectional diagrams illustrating progressive stages in forming an integrated circuit containing therein a plasma hardened patterned photoresist layer through the preferred embodiment of the method of the present invention.

DESCRIPTION OF THE PREFERRED EMBODIMENT

The present invention provides a method for plasma hardening a patterned photoresist layer within an integrated circuit against Reactive Ion Etch (RIE) etch plasmas to which the plasma hardened patterned photoresist layer may later be exposed. The method by which the present invention provides a plasma hardened patterned photoresist layer is by treating a patterned photoresist layer with a hydrogen containing plasma. Although the mechanism by which the hydrogen containing plasma interacts with the patterned photoresist layer to form a plasma hardened patterned photoresist layer is not entirely well understood, it is nonetheless clear that a patterned photoresist layer, when treated with a hydrogen containing plasma in accord with the method of the present invention, will be plasma hardened against Reactive Ion Etch (RIE) etch plasmas to which the plasma hardened patterned photoresist layer may later be exposed.

The method of the present invention may be employed in plasma hardening patterned photoresist layers, which plasma hardened patterned photoresist layers are in turn employed as etch masks for Reactive Ion Etch (RIE) plasma etching of blanket layers which reside beneath those plasma hardened patterned photoresist layers, within many types of integrated circuits. The method of the present invention may be employed in plasma hardening patterned photoresist layers employed as etch masks in forming patterned layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Metal Oxide Semiconductor Field Effect Transistors (MOSFETs), integrated circuits having within their fabrications bipolar transistors and integrated circuits having within their fabrications Bipolar Complementary Metal Oxide Semiconductor (BiCMOS) transistors. The method of the present invention has broad applicability in plasma hardening patterned photoresist layers within integrated circuits.

Referring now to FIG. 1 to FIG. 3 there is shown a series of schematic cross-sectional diagrams illustrating the results of progressive process steps in forming within an integrated circuit a plasma hardened patterned photoresist layer in accord with the preferred embodiment of the method of the present invention. Shown in FIG. 1 is a schematic cross-sectional diagram illustrating the results of early stages in forming the integrated circuit.

Shown in FIG. 1 is a semiconductor substrate 10 upon and within whose surface there are formed isolation regions 12a and 12b. Semiconductor substrates upon which the method of the present invention may be practiced may be formed with either dopant polarity, any dopant concentration and any crystallographic orientation. Typically, the semiconductor substrate 10 upon which is practiced the method of the present invention is a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor substrate exposed through an appropriate mask is thermally oxidized to form isolation regions within and upon the semiconductor substrate, and methods whereby a separate insulating layer is formed upon a semiconductor substrate and subsequently patterned to form isolation regions upon the semiconductor substrate. For the preferred embodiment of the method of the present invention, the isolation regions 12a and 12b are preferably formed through a thermal oxidation method whereby portions of the semiconductor substrate 10 exposed through an oxidation mask are consumed to form within and upon the semiconductor substrate 10 isolation regions 12a and 12b of silicon oxide.

Also illustrated within FIG. 1 is a gate oxide layer 14 upon which resides a gate electrode 16. Both the gate oxide layer 14 and the gate electrode 16 reside upon the active semiconductor region of the semiconductor substrate 10. Both the gate oxide layer 14 and the gate electrode 16 are components of a Metal Oxide Semiconductor Field Effect Transistor (MOSFET).

Methods and materials through which gate oxide layers and gate electrodes may be formed upon active semiconductor regions of semiconductor substrates are known in the art. Gate oxide layers may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art to form gate oxide layers.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the method of the present invention, the gate oxide layer 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 70 to about 150 angstroms. For the preferred embodiment of the present invention, the gate electrode 16 is preferably formed through patterning and etching a blanket layer of highly doped polysilicon formed upon the blanket gate oxide layer at a thickness of about 2500 to about 3000 angstroms through a Chemical Vapor Deposition (CVD) process employing silane as the silicon source material along with suitable dopant species. Once the blanket layer of highly doped polysilicon has been patterned to yield the gate electrode 16, the gate electrode 16 may be employed as an etch mask to pattern the gate oxide layer 14 from the blanket gate oxide layer.

Finally, there is shown in FIG. 1 source/drain electrodes 18a and 18b formed within the surface of the active semiconductor region of the semiconductor substrate 10 at areas not occupied by the gate electrode 16, the gate oxide layer 14 and the isolation regions 12a and 12b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are con, non in the art. For the preferred embodiment of the present invention, the source/drain electrodes 18a and 18b are preferably formed through implanting a suitable dopant species into the active region of the semiconductor substrate 10 at about 1E14 to about 1E16 ions per square centimeter dose and about 50 to about 150 keV ion implantation energy.

Having formed a Metal Oxide Semiconductor Field Effect Transistor (MOSFET) structure comprising source/drain electrodes 18a and 18b formed into the semiconductor substrate 10, and a gate electrode 16 upon a gate oxide layer 14 adjoining the source/drain electrodes 18a and 18b, the next series of process steps in forming the plasma hardened patterned photoresist layer of the preferred embodiment of the method of the present invention may proceed. The results of those process steps are illustrated by the integrated circuit whose schematic cross-sectional diagram is shown in FIG. 2.

Shown in FIG. 2 is the presence of a blanket planarized Pre-Metal Dielectric (PMD) layer 20 formed upon the surface of the integrated circuit whose structure is illustrated in FIG. 1. Methods and materials through which blanket planarized Pre-Metal Dielectric (PMD) layers may be formed within integrated circuits are known in the art. Blanket planarized Pre-Metal Dielectric (PMD) dielectric layers are typically formed through planarizing through methods as are conventional in the art of blanket conformal Pre-Metal Dielectric (PMD) layers formed within integrated circuits. The blanket conformal Pre-Metal Dielectric (PMD) layers may be formed through methods and materials including but not limited to Chemical Vapor Deposition (CVD) methods, Plasma Enhanced Chemical Vapor Deposition (PECVD) methods and Physical Vapor Deposition (PVD) sputtering methods through which may be deposited dielectric materials including but not limited to silicon oxide dielectric materials, silicon nitride dielectric materials and silicon oxynitride dielectric materials. The blanket conformal Pre-Metal Dielectric (PMD) layers may be planarized through methods including but not limited to Reactive Ion Etch (RIE) etchback planarizing methods and Chemical Mechanical Polish (CMP) planarizing methods.

For the preferred embodiment of the method of the present invention, the blanket planarized Pre-Metal Dielectric (PMD) layer 20 is preferably formed from a blanket conformal Pre-Metal Dielectric (PMD) layer formed of a silicon oxide deposited upon the semiconductor substrate 10 through a Plasma Enhanced Chemical Vapor Deposition (PECVD) method, as is common in the art. The blanket conformal Pre-Metal Dielectric (PMD) layer is preferably planarized to form the blanket planarized Pre-Metal Dielectric (PMD) layer 20 through a Chemical Mechanical Polish (CMP) planarizing method, as is also common in the art. Alternative methods and materials may, however, be employed in forming and planarizing the blanket planarized Pre-Metal Dielectric (PMD) layer 20.

Also shown in FIG. 2 is the presence of a blanket layer 24 which is desired to be patterned. There are several methods and materials through which blanket layers, including but not limited to blanket conductor layers, blanket semiconductor layers and blanket insulator layers, may be formed within integrated circuits. However, typically and preferably, although not exclusively, the blanket layer 24 for the preferred embodiment of the method of the present invention is a blanket conductor layer. Most typically and most preferably, the blanket conductor layer is a blanket conductor metal layer. Preferably, the conductor metal from which is formed the blanket conductor metal layer is an aluminum containing metal alloy conductor metal. Other conductor metals may however also be employed in forming the blanket conductor metal layer, including but not limited to copper metal and copper metal alloys. Preferably, the thickness of the blanket layer 24 is from about 6000 to about 10000 angstroms.

Also shown in FIG. 2 is the presence of a series of patterned photoresist layers 26a, 26b and 26c, formed upon the surface of the blanket layer 24. The patterned photoresist layers 26a, 26b and 26c serve as an etch mask for patterning the blanket layer 24. Although the present invention may in general be practiced with patterned photoresist layers 26a, 26b and 26c formed of several types of photoresist materials, the present invention is preferably practiced with patterned photoresist layers 26a, 26b and 26c formed from a photoresist material chosen from the group of photoresist materials consisting of novolak photoresist materials and Poly Methyl Meth Acrylate (PMMA) photoresist materials. The present invention will work equally well with patterned negative photoresist layers and patterned positive photoresist layers, provided that the photoresist material from which is formed the patterned negative photoresist layers or the patterned positive photoresist layers is susceptible to being plasma hardened through the methods and materials of the present invention. Preferably, the patterned photoresist layers 26a, 26b and 26c are from about 16500 to about 20000 angstroms thick each.

Finally, there is shown in FIG. 2 the presence of a first plasma 28 through which is hardened the patterned photoresist layers 26a, 26b and 26c. Although methods and materials through which plasmas may be formed and employed are known in the art of integrated circuit manufacture, not all plasmas which are known in the art of integrated circuit manufacture will be useful as a first plasma 28 in plasma hardening the patterned photoresist layers 26a, 26b and 26c through the method of the present invention. It has been found experimentally that a hydrogen containing plasma is most useful as a first plasma 28 in plasma hardening the patterned photoresist layers 26a, 26b and 26c. Thus, for the present invention it is preferred that the first plasma 28 is a hydrogen containing plasma. Preferably, the hydrogen containing first plasma 28 contains about 5 to about 20 percent hydrogen by volume. Preferably, the remainder of the first plasma 28 is formed of helium. Preferably, the hydrogen containing first plasma 28 is provided at a radio frequency power of from about 300 to about 600 watts, a reactor chamber pressure of from about 1 to about 3 torr and a hydrogen flow rate of from about 125 to about 500 standard cubic centimeters per minute (sccm). Preferably, the patterned photoresist layers 26a, 26b and 26c are exposed to the hydrogen containing first plasma 28 for a time period of from about 60 to about 120 seconds.

Referring now to FIG. 3 there is shown a schematic cross-sectional diagram illustrating the results of further processing of the integrated circuit whose schematic cross-sectional diagram is illustrated in FIG. 2. Shown in FIG. 3 is the presence of plasma hardened patterned photoresist layers 26a', 26b' and 26c' through which is patterned the blanket layer 24 illustrated in FIG. 2, to yield the patterned layers 24a, 24b and 24c. Methods and materials through which may be patterned blanket layers while employing hardened patterned photoresist layers as etch masks are known in the art. Blanket layers may be patterned under such circumstances to yield patterned layers through methods including but not limited to wet chemical etch methods and Reactive Ion Etch (RIE) plasma etch methods. For the preferred embodiment of the method of the present invention, the patterned layers 24a, 24b and 24c are preferably formed from the blanket layer 24 through a Reactive Ion Etch (RIE) plasma etching method employing a second plasma 30. For a blanket layer 24 most preferably formed of an aluminum containing metal alloy conductor metal, the second plasma 30 is preferably a chlorine containing plasma. Preferably, the chlorine containing second plasma 30 contains about 30 to about 50 percent chlorine. Preferably, the chlorine containing second plasma 30 is provided at a radio frequency power of from about 400 to about 800 watts, a reactor chamber pressure of from about 100 to about 300 mtorr and a chlorine flow rate of from about 35 to about 80 standard cubic centimeters per minute (sccm). Preferably, the blanket layer 24 is exposed to the chlorine containing second plasma 30 for a time sufficient to form the patterned layers 24a, 24b and 24c from the blanket layer 24. Alternative second plasma 30 compositions may be employed in patterning the blanket layer 24, when the blanket layer 24 is formed from materials other than aluminum containing metal alloy conductor metals.

Upon Reactive Ion Etch (RIE) plasma etching the blanket layer 24 to form the patterned layers 24a, 24b and 24c, there is formed an integrated circuit through the preferred embodiment of the method of the present invention. The integrated circuit so formed has formed therein a patterned layer, the patterned layer being formed through Reactive Ion Etch (RIE) plasma etching of a blanket layer employing a plasma hardened patterned photoresist layer as an etch mask. Although not specifically illustrated by the drawings which accompany this description, the plasma hardened patterned photoresist layers formed through the preferred embodiment of the method of the present invention are preferably plasma hardened in-situ prior to employing the plasma hardened patterned photoresist layers in patterning blanket layers through a Reactive Ion Etch (RIE) plasma etch method.

EXAMPLES

A series of six semiconductor substrates was obtained, and each semiconductor substrate within the series of six semiconductor substrates was coated with a blanket conductor layer. Each blanket conductor layer had formed thereupon a blanket photoresist layer. The blanket conductor layers were blanket aluminum-0.5% copper conductor layers formed to a thickness of about 9000 angstroms. The blanket photoresist layers were formed of a TOK-3100 brand positive photoresist. Each blanket photoresist layer was coated upon each blanket conductor layer at a thickness of about 16500 angstroms.

The blanket photoresist layers were then photo-exposed and developed to form a series of patterned parallel photoresist lines upon the surfaces of each of the blanket aluminum-0.5% copper conductor layers. The patterned parallel photoresist lines were about 8000 angstroms in width each and they were separated by a distance of about 7000 angstroms.

The six semiconductor substrates were then separated into three groups of two semiconductor substrates. One group of two semiconductor substrates received a post-bake treatment at 90 degrees centigrade for a time period of 50 seconds. The second group of two semiconductor substrates received a post-bake treatment at 120 degrees centigrade for a time period of about 20 seconds. The third group of two semiconductor substrates received no post-bake treatment.

Each of the six semiconductor substrates was then exposed to a plasma treatment through which the blanket aluminum-0.5% copper conductor metal layer residing beneath the patterned parallel photoresist lines was etched to form a series of parallel patterned aluminum-0.5% copper conductor metal lines beneath the patterned parallel photoresist lines. The blanket aluminum-0.5% copper conductor metal layers were etched in a plasma containing chlorine, boron trichloride and nitrogen at a chlorine flow rate of about 35 standard cubic centimeters per minute (sccm), a reactor chamber pressure of about 125 mtorr and a radio frequency power of about 450 watts.

Prior to etching the blanket aluminum-0.5% copper conductor metal layers to form the patterned parallel aluminum-0.5% copper conductor metal lines, one semiconductor substrate from each of the three groups of two semiconductor substrates received an in situ hydrogen containing plasma hardening treatment in accord with the preferred embodiment of the present invention. The three semiconductor substrates so treated were exposed to a 1:9 volume ratio hydrogen:helium plasma at a total hydrogen-helium flow rate of about 3000 standard cubic centimeters per minute (sccm), a reactor chamber pressure of about 2 torr, a radio frequency power of about 550 watts and an exposure time of about 120 seconds.

The extent of softening, erosion and/or consumption of the patterned parallel photoresist lines above the patterned parallel aluminum-0.5% copper conductor metal lines was then observed with the aid of an electron microscope. The results observed are reported in TABLE I.

TABLE I

| EXAMPLE | hard bake | plasma harden | resist flow |
| --- | --- | --- | --- |
| 1 | no | no | yes |
| 2 | no | yes | no |
| 3 | 90C/50 sec | no | yes |
| 4 | 90C/50 sec | yes | no |
| 5 | 120C/20 sec | no | yes |
| 6 | 120C/20 sec | yes | no |

From review of the data in TABLE I it is seen that a hydrogen containing plasma hardening, in accord with the preferred embodiment of the method of the present invention, provides a plasma hardened patterned photoresist layer which may be employed as a mask when etching a blanket aluminum-0.5% copper conductor layer which resides beneath the plasma hardened patterned photoresist layer. The plasma hardened patterned photoresist layer so formed is not susceptible to softening, erosion or consumption. Analogous patterned photoresist layers which have not received a hydrogen containing plasma hardening are subject to softening, erosion or consumption under equivalent conditions.

As is understood by a person skilled in the art, the preferred embodiment and examples of the method of the present invention are illustrative of the method of the present invention rather than limiting of the method of the present invention. Modifications may be made to methods, materials, structures and dimensions through which are practiced the preferred embodiment and examples of the method of the present invention while still practicing embodiments and examples which are within the spirit and scope of the method of the present invention. In particular, the method of the present invention may be employed in patterning blanket layers other than blanket conductor metal layers, within integrated circuits. In addition, the method of the present invention may be employed in patterning blanket layers within various locations within integrated circuits.

What is claimed is:

1. A method for plasma hardening a patterned photoresist layer comprising:

providing a semiconductor substrate;

forming over the semiconductor substrate a patterned photoresist layer; and treating the patterned photoresist layer with a helium-hydrogen plasma, without baking the patterned photoresist layer, to form from the patterned photoresist layer a plasma hardened patterned photoresist layer.

2. The method of claim 1 wherein the patterned photoresist layer is from about 16500 to about 20000 angstroms thick.

3. The method of claim 1 wherein the patterned photoresist layer is formed from a photoresist material selected from the group of photoresist materials consisting of novolak photoresist materials and Poly Methyl Meth Acrylate (PMMA) photoresist materials.

4. The method of claim 1 wherein the helium-hydrogen plasma contains about 5 to about 20 percent hydrogen by volume.

5. The method of claim 4 wherein the patterned photoresist layer is exposed to the helium-hydrogen plasma at a radio frequency power of from about 300 to about 600 watts for a time period of from about 60 to about 120 seconds.

6. A method for patterning a blanket layer within an integrated circuit comprising:

providing a semiconductor substrate;

forming over the semiconductor substrate a blanket layer;

forming upon the blanket layer a patterned photoresist layer;

exposing the patterned photoresist layer to a helium-hydrogen plasma, without baking the patterned photoresist layer, to form from the patterned photoresist layer a plasma hardened patterned photoresist layer; and etching through a Reactive Ion Etch (RIE) etch plasma portions of the blanket layer exposed through the plasma hardened patterned photoresist layer to form a patterned layer.

7. The method of claim 6 wherein the blanket layer is a blanket conductor layer.

8. The method of claim 7 wherein the thickness of the blanket conductor layer is from about 6000 to about 10000 angstroms.

9. The method of claim 6 wherein the patterned photoresist layer is from about 16500 to about 20000 angstroms thick.

10. The method of claim 6 wherein the patterned photoresist layer is formed from a photoresist material selected from the group of photoresist materials consisting of novolak photoresist materials and Poly Methyl Meth Acrylate (PMMA) photoresist materials.

11. The method of claim 6 wherein the helium-hydrogen plasma contains about 5 to about 20 percent hydrogen by volume.

12. The method of claim 11 wherein the patterned photoresist layer is exposed to the helium-hydrogen plasma at a radio frequency power of from about 300 to about 600 watts for a time period of from about 60 to about 120 seconds.

13. A method for patterning a blanket aluminum containing conductor layer within an integrated circuit comprising:

providing a semiconductor substrate;

forming over the semiconductor substrate a blanket aluminum containing conductor layer;

forming upon the blanket aluminum containing conductor layer a patterned photoresist layer;

exposing the patterned photoresist layer to a helium-hydrogen plasma, without baking the patterned photoresist layer, to form from the patterned photoresist layer a plasma hardened patterned photoresist layer; and etching through a Reactive Ion Etch (RIE) etch plasma portions of the blanket aluminum containing conductor layer exposed through the patterned photoresist layer to form a patterned aluminum containing conductor layer.

14. The method of claim 13 wherein the thickness of the blanket aluminum containing conductor layer is from about 6000 to about 10000 angstroms.

15. The method of claim 13 wherein the patterned photoresist layer is from about 16500 to about 20000 angstroms thick.

16. The method of claim 13 wherein the patterned photoresist layer is formed from a photoresist material selected from the group of photoresist materials consisting of novolak photoresist materials and Poly Methyl Meth Acrylate (PMMA) photoresist materials.

17. The method of claim 13 wherein the helium-hydrogen plasma contains about 5 to about 20 percent hydrogen by volume.

18. The method of claim 17 wherein the patterned photoresist layer is exposed to the helium-hydrogen plasma at a radio frequency power of from about 300 to about 600 watts for a time period of from about 60 to about 120 seconds.

19. The method of claim 13 wherein the Reactive Ion Etch (RIE) etch plasma is formed of a chlorine containing plasma.

* * * * *